US008323736B2

(12) United States Patent
Quick et al.

(10) Patent No.: US 8,323,736 B2
(45) Date of Patent: *Dec. 4, 2012

(54) METHODS OF FORMING METAL-CONTAINING STRUCTURES, AND METHODS OF FORMING GERMANIUM-CONTAINING STRUCTURES

(75) Inventors: Timothy A. Quick, Boise, ID (US); Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/426,926

(22) Filed: Mar. 22, 2012

(65) Prior Publication Data

US 2012/0178209 A1    Jul. 12, 2012

Related U.S. Application Data

(63) Continuation of application No. 12/273,737, filed on Nov. 19, 2008, now Pat. No. 8,163,341.

(51) Int. Cl.
*C23C 16/00*  (2006.01)
*C23C 16/06*  (2006.01)
*C23C 16/18*  (2006.01)

(52) U.S. Cl. ......... 427/255.28; 427/248.1; 427/255.395; 427/255.7; 427/250; 427/301; 427/304; 438/758; 438/761; 438/763

(58) Field of Classification Search ............... 427/248.1, 427/255.28, 255.29, 255.395, 255.7, 250, 427/301, 304; 438/758, 761, 763
See application file for complete search history.

(56) References Cited

U.S. PATENT DOCUMENTS

| | | | |
|---|---|---|---|
| 6,207,551 B1 | 3/2001 | Chungpaiboonpatana et al. | |
| 7,094,690 B1 | 8/2006 | Sandhu et al. | |
| 7,144,784 B2 | 12/2006 | Min et al. | |
| 7,202,166 B2 | 4/2007 | Wilk | |
| 7,838,329 B2 | 11/2010 | Hunks et al. | |
| 2003/0124259 A1 | 7/2003 | Kodas et al. | |
| 2005/0186342 A1 | 8/2005 | Sager et al. | |
| 2006/0093848 A1 | 5/2006 | Senkevich et al. | |
| 2007/0037391 A1 | 2/2007 | Thompson | |
| 2007/0037392 A1 | 2/2007 | Thompson | |
| 2007/0087581 A1 | 4/2007 | Singh et al. | |
| 2007/0123060 A1 | 5/2007 | Rahtu | |
| 2007/0254488 A1 | 11/2007 | Huotari et al. | |

FOREIGN PATENT DOCUMENTS

| | | |
|---|---|---|
| WO | WO 2006/012052 | 2/2006 |
| WO | WO 2007/019437 | 2/2007 |
| WO | WO 2008/057616 | 5/2008 |
| WO | WO 2008/085426 | 7/2008 |

*Primary Examiner* — Matthew Daniels
*Assistant Examiner* — Dennis Cordray
(74) *Attorney, Agent, or Firm* — Wells St. John P.S.

(57) ABSTRACT

Some embodiments include methods of forming metal-containing structures. A first metal-containing material may be formed over a substrate. After the first metal-containing material is formed, and while the substrate is within a reaction chamber, hydrogen-containing reactant may be used to form a hydrogen-containing layer over the first metal-containing material. The hydrogen-containing reactant may be, for example, formic acid and/or formaldehyde. Any unreacted hydrogen-containing reactant may be purged from within the reaction chamber, and then metal-containing precursor may be flowed into the reaction chamber. The hydrogen-containing layer may be used during conversion of the metal-containing precursor into a second metal-containing material that forms directly against the first metal-containing material. Some embodiments include methods of forming germanium-containing structures, such as, for example, methods of forming phase change materials containing germanium, antimony and tellurium.

10 Claims, 4 Drawing Sheets

METHODS OF FORMING METAL-CONTAINING STRUCTURES, AND METHODS OF FORMING GERMANIUM-CONTAINING STRUCTURES

RELATED PATENT DATA

This patent resulted from a continuation of U.S. patent application Ser. No. 12/273,737 now U.S. Pat. No. 8,163,341, which was filed Nov. 19, 2008, and which is hereby incorporated herein by reference.

TECHNICAL FIELD

Methods of forming metal-containing structures, and methods of forming germanium-containing structures.

BACKGROUND

Integrated circuit (IC) fabrication often involves formation of metal-containing materials over semiconductor substrates. Such formation may utilize a deposition process such as, for example, one or more of atomic layer deposition (ALD), chemical vapor deposition (CVD) and physical vapor deposition (PVD).

A metal-containing material is any material that comprises "metal." The elements of the periodic table may be classified as being either metals or nonmetals on the basis of their general physical and chemical properties. However, a few elements have intermediate properties, and these elements are sometimes classified as metalloids. The metalloids include boron, silicon, germanium, arsenic, antimony, tellurium and polonium. The term "metal" is utilized herein and in the claims that follow to refer to any element that would not be classified as a "nonmetal", and thus includes metalloids as well as regular metals.

The metal-containing materials incorporated into ICs may be utilized in any of numerous devices and structures. For instance, the metal-containing materials may be utilized for electrically conductive structures (for instance, conductive regions of wordlines, bitlines, and other lines; electrodes of capacitors; bond pads; etc.), and/or for phase change materials (for instance, mixtures of germanium, antimony and tellurium may be utilized to form phase change materials).

The properties of metal-containing materials may be altered by the purity of the metal-containing materials, and often desired electrical properties are better achieved with high purity metal-containing materials than with lower purity metal-containing materials. Also, it can be easier to maintain consistency amongst a plurality of devices if the metal-containing materials are of high purity than if the metal-containing materials are of lower purity, since the types and amounts of impurities within the lower purity metal-containing materials may fluctuate—which may lead to differences in electrical properties amongst the devices.

One method of forming metals is to utilize metal amidinates and ammonia in ALD processes. For instance, germanium may be deposited utilizing sequential pulses of germanium amidinate [such as, for example, bis(N,N'-diisopropylbutylamidinate)-N-germanium (II)], and ammonia. However, the layers formed by such deposition may contain high levels of carbon and nitrogen contamination; with example high levels of carbon and nitrogen contamination being about eight atomic percent and about five atomic percent, respectively.

Another method of forming metals to utilize formic acid to reduce metal amidinates during CVD processes. For instance, copper amidinate may be reduced by formic acid during a CVD process to form a copper deposit. It is believed that the copper acts as a catalyst during the CVD process to form monatomic hydrogen from the catalytic decomposition of formic acid, and that such hydrogen then reduces the amidinate to form the copper deposit.

Although the formic acid CVD processes work with some metal amidinates, there are other metal amidinates that lack the ability to self-catalyze formation of hydrogen from formic acid, and that accordingly are not suitable for utilization in the formic acid CVD processes.

It is desired to develop new methods of forming metal-containing materials suitable for utilization in integrated circuitry.

DETAILED DESCRIPTION OF THE ILLUSTRATED EMBODIMENTS

In some embodiments, ALD methods are utilized for forming metal-containing materials from metal-containing precursors (such as, for example, metal amidinate precursors). The ALD methods utilize one or both of formic acid and formaldehyde in addition to the metal-containing precursors.

Prior to utilization of the ALD, a metal-containing surface is formed across a semiconductor substrate. The metal-containing surface may be formed with any suitable processing.

In operation, the metal-containing surface is used as a catalyst to form hydrogen from formic acid (and/or formaldehyde) in a first ALD stage. Subsequently, the hydrogen is used to break down a metal-containing precursor in a second ALD stage. This is in contrast to the prior art methods of formic acid CVD (discussed above in the "background" section) in which the metal of a metal amidinate is simultaneously utilized as both a catalyst for breaking down formic acid, and as a deposited material resulting from reduction of the metal amidinate.

An example embodiment is described with reference to a flow chart of FIG. 1. An initial processing stage 2 comprises provision of a substrate into a reaction chamber. The substrate may be, for example, a semiconductor substrate, such as a monocrystalline silicon wafer at a processing stage associated with the fabrication of integrated circuitry. The substrate has a metal-containing surface. The metal-containing surface may be formed with any suitable processing. In some embodiments, the metal-containing surface may be formed by deposition of metal-containing material utilizing one or more of ALD, CVD and PVD. Such metal-containing material may comprise, consist essentially of, or consist of, for example, tungsten, titanium, copper, aluminum, ruthenium, germanium, antimony, tellurium, etc.

Figure 1:
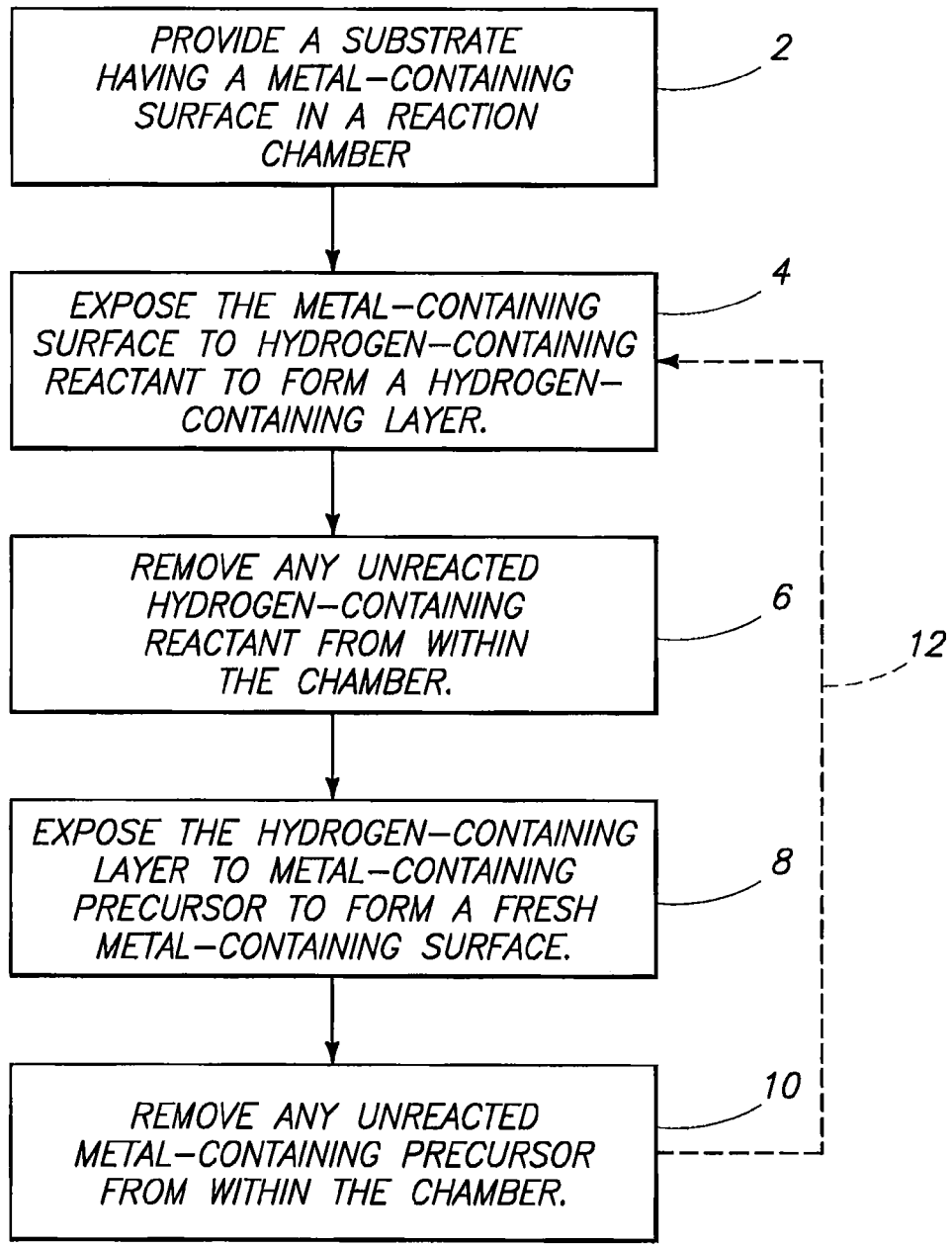
FIG. 1 is a flow chart diagram of an embodiment.

While the substrate is within the reaction chamber, processing stage 4 of the flow chart of FIG. 1 is conducted. Specifically, the metal-containing surface is exposed to a hydrogen-containing reactant to form a hydrogen-containing layer. The hydrogen-containing reactant may comprise, consist essentially of, or consist of one or both of formic acid and formaldehyde.

At processing stage 6 of the flow chart of FIG. 1, any unreacted hydrogen-containing reactant is removed from within the chamber with a suitable purge. Such purge may utilize, for example, flow of an inert purging gas through the chamber, and/or vacuum to draw any unreacted hydrogen-containing reactant out of the chamber.

At processing stage 8 of the flow chart of FIG. 1, metal-containing precursor is flowed into the reaction chamber, and thus the hydrogen-containing layer is exposed to the metal-containing precursor. The metal-containing precursor may comprise a metal amidinate, such as, for example, germanium amidinate. The exposure of the metal-containing precursor to the hydrogen-containing layer may reduce the amidinate, and thereby release metal from the metal-containing precursor to form a fresh metal-containing surface over the initial metal-containing surface that had been present at the processing stage 2 of FIG. 1.

In some embodiments, the metal released from the metal-containing precursor is the same as the metal of the initial metal-containing surface at the processing stage 2 of FIG. 1. Thus the processing of FIG. 1 may be utilized to create several layers of the same metal. The layers may be considered to merge into a single thick structure comprising, consisting essentially of, or consisting of the metal. In other embodiments, the metal released from the metal-containing precursor is different from the initial metal-containing surface at the processing stage 2 of FIG. 1. Thus, the processing of FIG. 1 may be utilized to create multiple layers of different metals.

At processing stage 10 of the flow chart of FIG. 1, any unreacted metal-containing precursor is removed from within the chamber with a suitable purge.

A dashed line 12 is provided to show that the processing stages 4, 6, 8 and 10 may be repeated in multiple iterations to form a stack of layers. The fresh metal-containing surface formed at processing stage 8 will be the metal-containing surface utilized at the processing stage 4 during iterations that have processing stage 4 following processing stage 10. The metal-containing precursor may be varied in embodiments that utilized multiple iterations of processing stages 4, 6, 8 and 10; or may be the same during the multiple iterations.

FIGS. 2-10 show semiconductor constructions at processing stages of some example embodiments.

Figure 2:
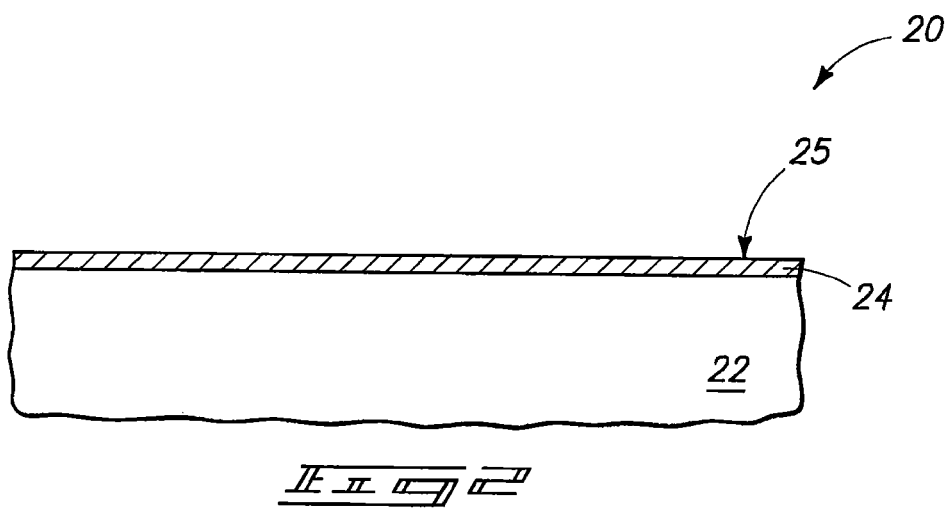
FIGS. 2-7 are a diagrammatic, cross-sectional side views of a portion of a semiconductor construction shown at various process stages of an embodiment.

Referring to FIG. 2, a portion of a semiconductor construction 20 is illustrated. The semiconductor construction comprises a semiconductor substrate 22 having a metal-containing material 24 formed thereover. The metal-containing material 24 has an upper metal-containing surface 25.

Semiconductor substrate 22 may, for example, comprise, consist essentially of, or consist of monocrystalline silicon lightly doped with background p-type dopant. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, the semiconductive substrates described above. Although the substrate 22 is shown to be homogeneous, in some embodiments the substrate may comprise one or more layers or structures associated with integrated circuit fabrication. Such layers or structures may be electrically insulative, electrically conductive, and/or semiconductive.

Metal-containing material 24 may comprise any metal-containing material, and may be in any suitable configuration. Accordingly, although metal-containing material 24 is shown as a layer extending across an upper planar surface of substrate 22, in other embodiments the metal layer may extend across an undulating topography; and may, for example, extend into a trench or over a pillar.

In some embodiments, metal-containing material 24 may comprise, consist essentially of, or consist of, for example, tungsten, titanium, copper, aluminum, ruthenium, germanium, antimony, tellurium, etc.

The metal-containing material 24 may be formed by any suitable processing, and in some embodiments may be deposited by one or more of ALD, CVD and PVD. The metal-containing material 24 may be referred to as a first metal-containing material to distinguish it from other metal-containing materials formed in subsequent processing (discussed below).

The semiconductor construction of FIG. 2 may be considered to be the substrate described at the processing stage 2 of the flow chart of FIG. 1, and accordingly may be provided within an ALD reaction chamber (not shown).

Figure 3:
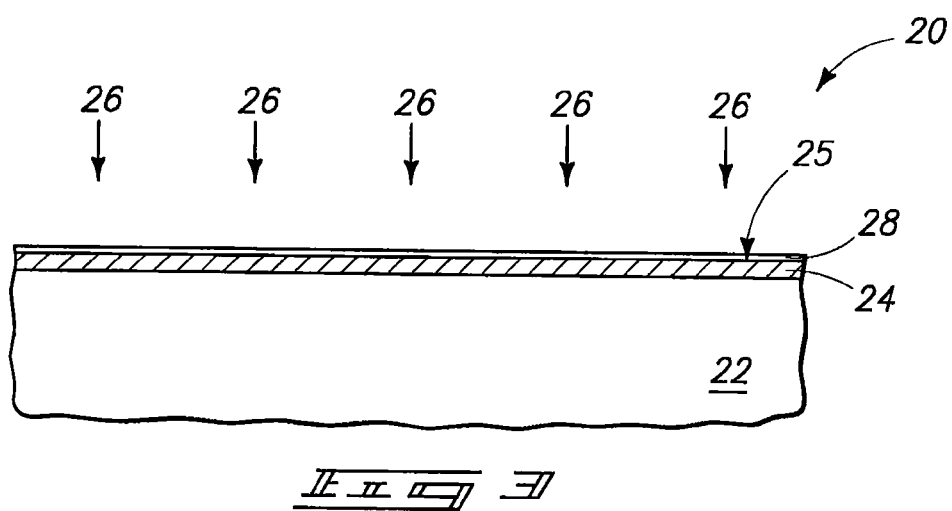

Referring to FIG. 3, hydrogen-containing reactant 26 is utilized to form a hydrogen-containing layer 28 across the surface 25 of metal-containing material 24. The hydrogen-containing reactant 26 may comprise, consist essentially of, or consist of one or both of formic acid and formaldehyde; and the hydrogen-containing layer 28 may comprise, consist essentially of, or consist of monatomic hydrogen created by catalytic decomposition of hydrogen-containing reactant 26 using metal of metal-containing layer 24. The hydrogen-containing reactant 26 may be alternatively referred to as a hydrogen-containing material, or as a hydrogen-containing precursor.

The processing stage of FIG. 3 may be considered to be an ALD processing stage, and accordingly hydrogen-containing layer 28 may be a monolayer, or partial monolayer, created through ALD processing. Construction 20 is within the ALD reaction chamber described with reference to FIG. 1 during the exposure of metal-containing layer 24 to hydrogen-containing reactant 26. The hydrogen-containing reactant 26 may be flowed into the ALD reaction chamber and left in the chamber under suitable temperature and pressure, and for a suitable duration, to form hydrogen-containing layer 28 as a saturated monolayer across the surface 25 of metal-containing material 24.

The semiconductor construction of FIG. 3 may be considered to be at the processing stage 4 of the flow chart of FIG. 1.

Figure 4:
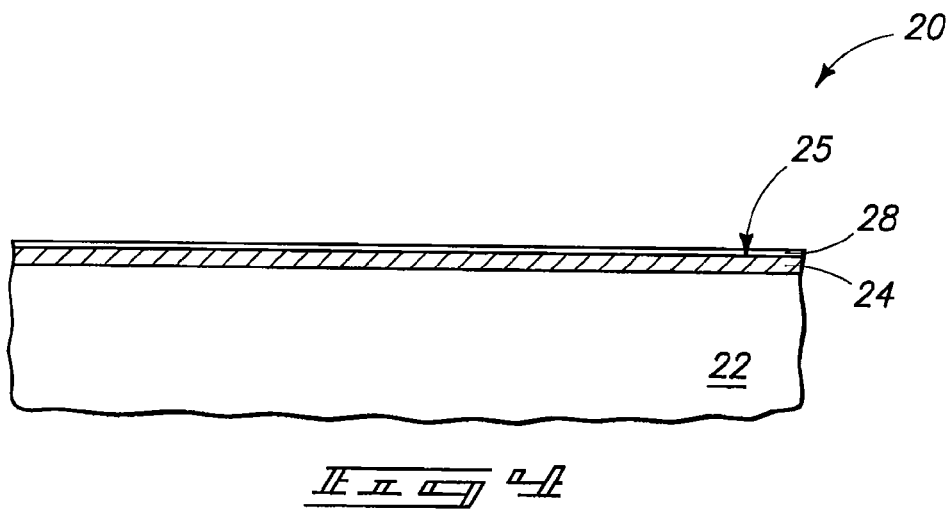

Referring to FIG. 4, any unreacted hydrogen-containing reactant 26 (FIG. 3) is removed from the ALD reaction chamber to leave the illustrated structure having hydrogen-containing layer 28 over metal-containing surface 25. The hydrogen-containing reactant may be removed with any suitable purge.

The semiconductor construction of FIG. 4 may be considered to be at the processing stage 6 of the flow chart of FIG. 1.

Figure 5:
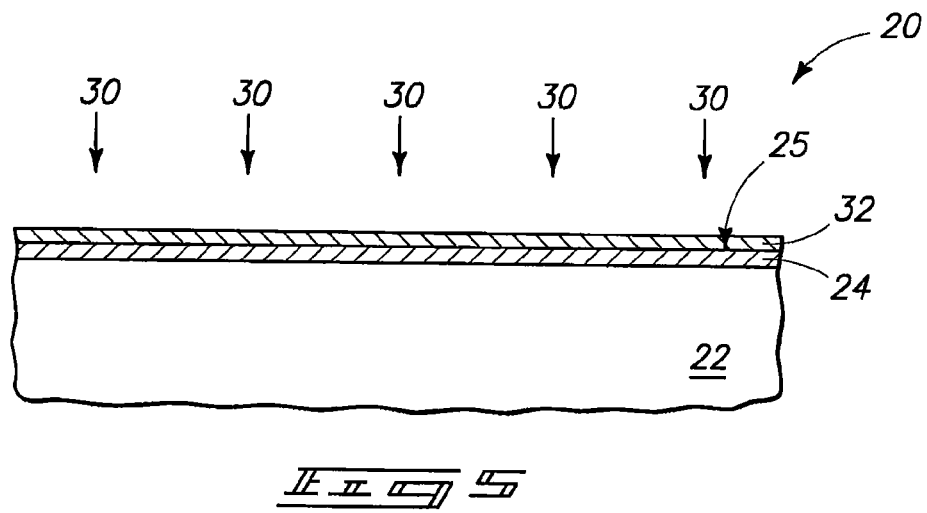

Referring to FIG. 5, metal-containing precursor 30 is utilized to form a second metal-containing material 32 directly against the first metal-containing material 24 (the term "directly against" is used to indicate that there are no intervening materials between the first and second metal-containing materials). The metal-containing precursor 30 may be flowed into the ALD reaction chamber after the hydrogen-containing material 26 (FIG. 3) has been exhausted from the chamber. The metal-containing precursor interacts with the hydrogen-containing layer 28 (FIG. 4) to convert the precursor into the metal of the second metal-containing layer 32. In some embodiments, the metal-containing precursor 30 may comprise a metal amidinate, and may interact with the hydrogen-containing layer 28 (FIG. 4) to cause reduction of the amidinate through the reaction of hydrogen of the hydrogen-containing layer with the amidinate. The hydrogen of the hydrogen-containing layer is incorporated into a reaction by-product while metal is released from the amidinate. Thus, the net reaction results in replacement of hydrogen-containing layer 28 (FIG. 4) with the second metal-containing material 32.

The second metal-containing material 32 may comprise any suitable metal, and in some embodiments may comprise, consist essentially of, or consist of one or more of germanium, antimony and tellurium. Accordingly, the metal-containing precursor 30 may comprise, consist essentially of or consist of germanium-containing precursor, antimony-containing precursor, or tellurium-containing precursor (for instance, germanium amidinate, antimony amidinate, or tellurium amidinate), in some embodiments.

The semiconductor construction of FIG. 5 may be considered to be at the processing stage 8 of the flow chart of FIG. 1.

Figure 6:
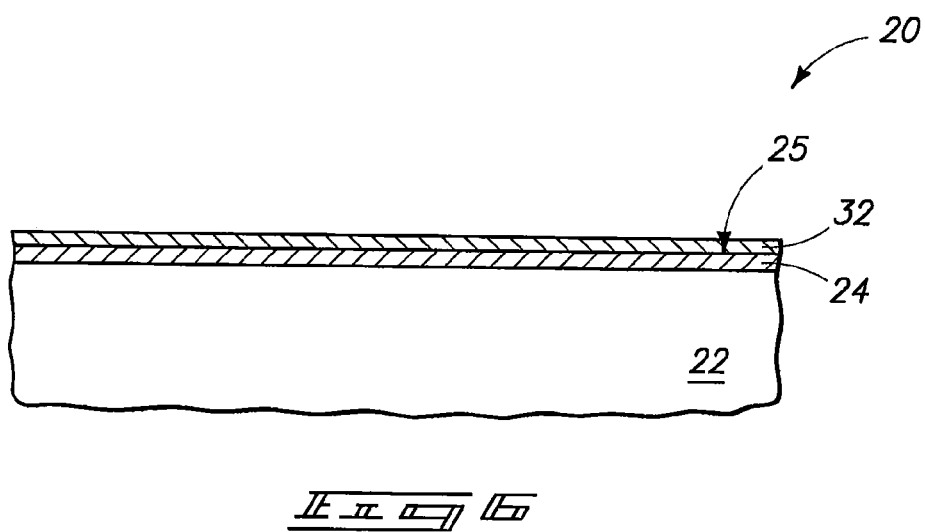

Referring to FIG. 6, any unreacted metal-containing precursor 30 (FIG. 5) is removed from the ALD reaction chamber to leave the illustrated structure having the second metal-containing material 32 directly against the metal-containing surface 25. The metal-containing precursor may be removed with any suitable purge.

The second metal-containing material 32 may contain a common metal as the first metal-containing material 24 in some embodiments, and may be entirely of a different metal from the first metal-containing material 24 in other embodiments. For instance, in some embodiments materials 24 and 32 may both be predominantly germanium (and may both consist essentially of, or consist of germanium); and in other embodiments one of the materials 24 and 32 may be predominantly germanium (and may consist essentially of, or consist of germanium in some embodiments) while the other of the materials 24 and 32 is predominantly antimony or tellurium (and may consist essentially of, or consist of antimony or tellurium in some embodiments).

The semiconductor construction of FIG. 6 may be considered to be at the processing stage 10 of the flow chart of FIG. 1.

The metal-containing material 32 may be much purer than metal-containing materials formed by conventional methods. For instance, if metal-containing material 32 comprises germanium formed utilizing formic acid as the hydrogen-containing reactant, and utilizing germanium amidinate as the metal-containing precursor, the material 32 may have a purity of greater than 95 atomic percent, or even greater than 99 atomic percent, relative to carbon, nitrogen and oxygen contamination, as measured by x-ray photoelectron spectroscopy (XPS).

The processing of FIGS. 3-6 may be considered to represent ALD processing in which a monolayer of hydrogen (layer 28 of FIGS. 3 and 4) is initially formed from hydrogen-containing reactant within an ALD reaction chamber, and then utilized to form a monolayer of metal (layer 32 of FIGS. 5 and 6) from metal-containing precursor within the ALD reaction chamber. The metal-containing precursor and hydrogen-containing reactant would be within the ALD reaction chamber at different and substantially non-overlapping times relative to one another. In other words, all, or least substantially all, of the hydrogen-containing reactant is removed from within the reaction chamber prior to introduction of the metal-containing precursor; and if multiple iterations of the process are conducted, all, or at least substantially all, of the metal-containing precursor is removed from within the reaction chamber prior to introduction of the hydrogen-containing precursor. The term "substantially all" indicates that any amount of the indicated material remaining within the reaction chamber is too low for gas phase reactions from such material to interfere with subsequent depositions utilizing other materials. In some embodiments, such may mean that at least all measurable amounts of the indicated material are removed from within the reaction chamber.

Figure 7:
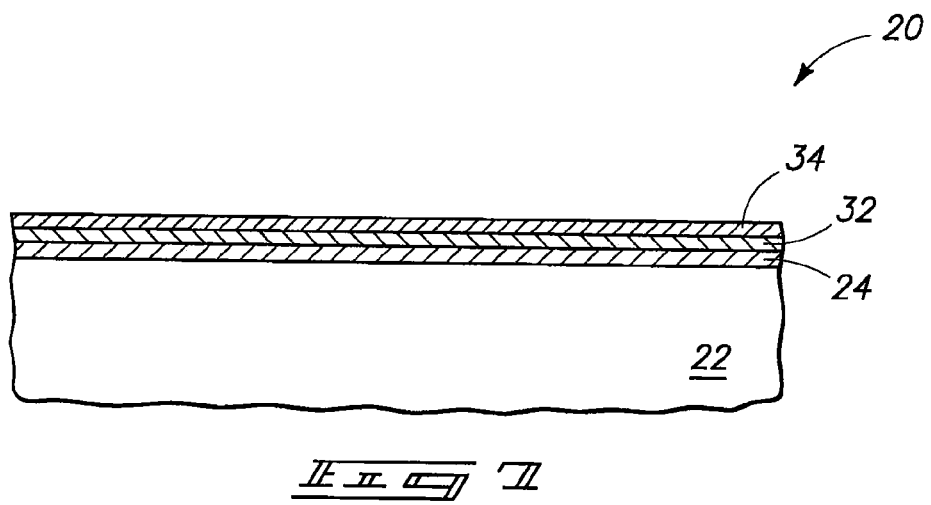

Referring to FIG. 7, the processing of FIGS. 3-6 may be repeated to form another metal-containing material 34 directly against metal-containing material 32. The metal-containing material 34 may have a metal in common with metal-containing material 32, or may consist of a different metal from the metal of metal-containing material 32.

Another embodiment is described with reference to FIGS. 8 and 9. In referring to FIGS. 8 and 9, similar numbering will be used as is used above to describe FIGS. 2-7, where appropriate.

Figure 8:
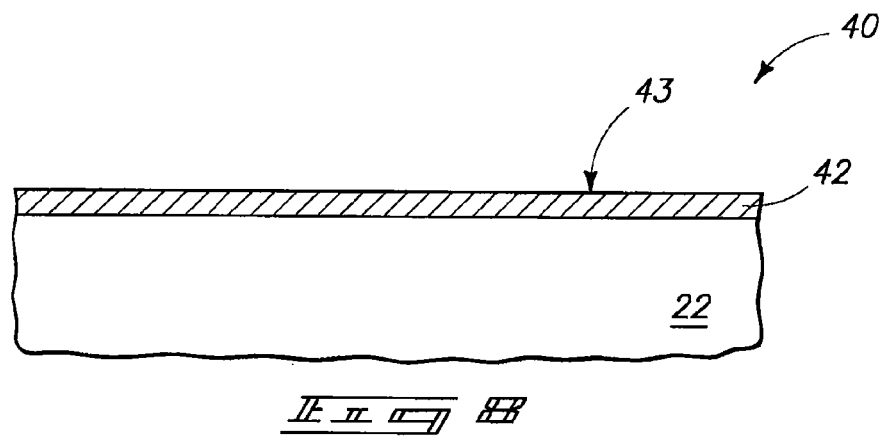
FIGS. 8 and 9 are diagrammatic, cross-sectional side views of a portion of a semiconductor construction shown at various process stages of an embodiment.

FIG. 8 shows a semiconductor construction 40 comprising a substrate 22 and a material 42 formed over the substrate. Material 42 may comprise germanium, and may be formed by any suitable method. In some embodiments, material 42 may be formed by ALD utilizing sequential pulses of germanium amidinate and ammonia. The ALD forms a plurality of layers which stack together to form material 42 to a desired thickness. As discussed above in the "background" section, the germanium-containing layers formed by deposition with germanium amidinate and ammonia may have high levels of carbon and nitrogen contamination. However, material 42 may be formed solely to provide a starting surface for subsequent ALD of the type described in FIG. 1 (i.e., ALD with formic acid or formaldehyde), which can then form a relatively high purity germanium-containing material over material 42.

In an example embodiment, material 42 may be formed to a thickness of less than or equal to about 25 angstroms. For instance, material 42 may be formed with less than or equal to about 100 ALD cycles utilizing germanium amidinate and a reductant (for instance, ammonia or $H_2$). The ALD process may utilize any suitable conditions, such as, for example, a chuck set point temperature of from about 200° C. to about 400° C., a chamber pressure of from about $10^{-4}$ Torr to about 10 Torr, with the germanium amidinate being heated to about 85° C. and flowed into the reaction chamber with helium as a carrier gas, and with the ammonia being flowed into the reaction chamber at about room temperature.

Material 42 has an upper surface 43, and such surface may be referred to as an initial germanium-containing surface.

Figure 9:
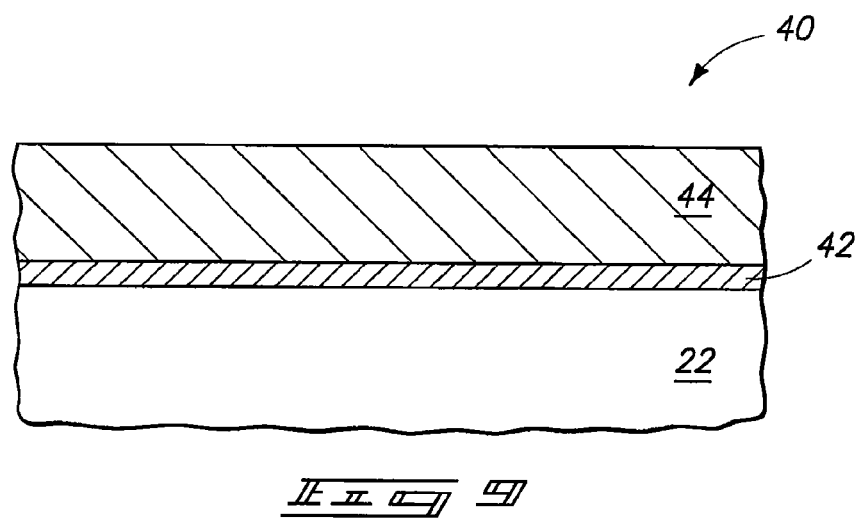

Referring to FIG. 9, a material 44 is formed over surface 43 of material 42. Materials 42 and 44 may be referred to as first and second materials, respectively. Material 44 may comprise, consist essentially of, or consist of germanium; and may be formed by an ALD process utilizing germanium amidinate and one or both of formic acid and formaldehyde with processing analogous to that described with reference to FIGS. 1-6. In an example embodiment, material 44 is formed to be at least about four times thicker than material 42. For instance, material 44 may be formed with at least about 400 ALD cycles utilizing germanium amidinate and formic acid. The ALD process may utilize any suitable conditions, such as, for example, a chuck set point temperature of from about 200° C. to about 400° C., a chamber pressure of from about $10^{-4}$ Torr to about 10 Torr, with the germanium amidinate being heated to about 85° C. and flowed into the reaction chamber with helium as a carrier gas, and with the formic acid being flowed into the reaction chamber at about room temperature.

The materials 42 and 44 together form a germanium-containing structure. The high purity of material 44, combined with the large relative amount of material 44 to material 42, enables the germanium-containing structure to be formed with high overall purity.

Figure 10:
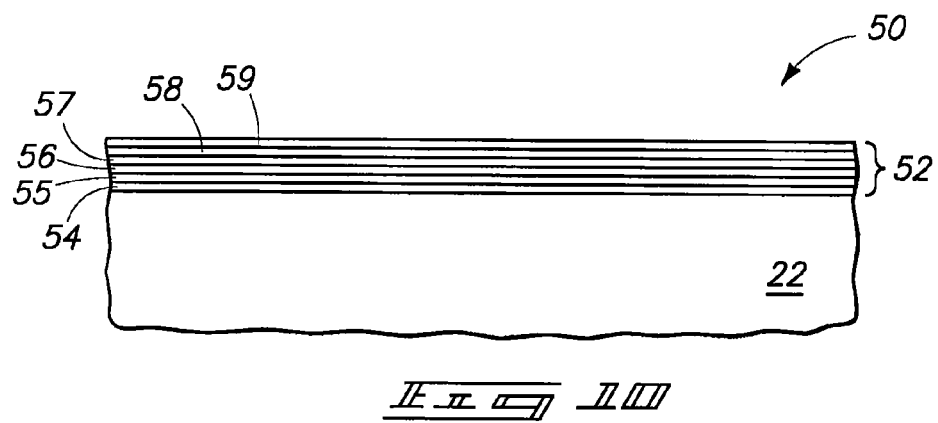
FIG. 10 is a diagrammatic, cross-sectional side view of a portion of a semiconductor construction shown at a process stage of an embodiment.

The embodiments discussed above may be utilized to form numerous structures and devices. FIG. 10 shows a portion of a semiconductor construction 50 illustrating one example structure, and specifically illustrating formation of a phase change structure 52 over a semiconductor substrate 22. The phase change structure includes a plurality of materials 54, 55, 56, 57, 58 and 59. At least some of the materials may be formed by atomic layer deposition. The individual materials may be of any suitable thickness, and in some embodiments may be very thin (for instance, may be formed with less than or equal to 10 ALD cycles) so that the structure 52 behaves like a mixture of the compositions utilized for materials 54, 55, 56, 57, 58 and 59.

In some embodiments, some of the materials 54-59 will comprise antimony, others tellurium, and yet others germanium. At least the materials that comprise germanium may be formed with ALD utilizing germanium amidinate and one or both of formic acid and formaldehyde, with processing analogous to one or more of the embodiments discussed above with reference to FIGS. 1-9. In some embodiments it will only be the germanium that is formed with processing analogous to embodiments discussed above with reference to FIGS. 1-9, and the other materials (specifically, the materials comprising antimony or tellurium) will be formed with conventional methods. In alternative embodiments, materials comprising antimony and/or materials comprising tellurium may also be formed with processing utilizing methods discussed above with reference to FIGS. 1-9.

The phase change structure 52 may have any suitable shape and compositional configuration, and may be incorporated into integrated circuitry devices. For instance, the phase change structure may be incorporated into memory devices of a phase change random access memory (PCRAM) array.

Although the embodiments discussed above were described with reference to integrated circuit fabrication, several of the embodiments may be utilized for fabrication of other structures in addition to, or alternatively to, integrated circuit structures. For instance, some embodiments may be utilized for fabrication of microelectromechanical systems (MEMS).

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a metal-containing structure, comprising:
   flowing hydrogen-containing reactant across a surface of a first metal-containing material to form a hydrogen-containing layer along the surface; the hydrogen-containing reactant comprising one or both of formic acid and formaldehyde;
   reacting hydrogen from the hydrogen-containing layer with a metal-containing precursor to form a second metal-containing material directly against the surface of the first metal-containing material; and
   wherein the second metal-containing material is purer than the first metal-containing material relative to one or more of oxygen, nitrogen and carbon contamination.

2. The method of claim 1 wherein the reacting with the metal-containing precursor is conducted in a same reaction chamber as the forming of the hydrogen-containing layer; and wherein the metal-containing precursor and hydrogen-containing reactant are within the reaction chamber at different and substantially non-overlapping times relative to one another.

3. The method of claim 1 wherein the hydrogen-containing reactant comprises formic acid.

4. The method of claim 1 wherein the hydrogen-containing reactant comprises formaldehyde.

5. The method of claim 1 wherein the surface of the first metal-containing material comprises germanium, and wherein the second metal-containing material also comprises germanium.

6. The method of claim 1 wherein the surface of the first metal-containing material comprises antimony or tellurium, and wherein the second metal-containing material comprises germanium.

7. A method of forming a germanium-containing structure, comprising:
   flowing hydrogen-containing reactant into a reaction chamber to form a hydrogen-containing layer across a germanium-containing surface of a first germanium-containing material;
   removing any unreacted hydrogen-containing reactant from within the reaction chamber;
   after removing unreacted hydrogen-containing reactant from within the reaction chamber, flowing germanium-containing precursor into the reaction chamber, the germanium-containing precursor reacting with hydrogen from the hydrogen-containing layer to form a second germanium-containing material directly against the first germanium-containing material; and
   wherein the first germanium-containing material is less pure in germanium than the second germanium-containing material.

8. A method of forming a germanium-containing structure, comprising:
   forming a first germanium-containing material from germanium amidinate and reductant; the reductant comprising one or both of $H_2$ and $NH_3$;
   flowing hydrogen-containing reactant into a reaction chamber to form a hydrogen-containing layer across a germanium-containing surface of the germanium-containing material;
   removing any unreacted hydrogen-containing reactant from within the reaction chamber;
   after removing unreacted hydrogen-containing reactant from within the reaction chamber, flowing germanium-containing precursor into the reaction chamber, the germanium-containing precursor reacting with hydrogen from the hydrogen-containing layer to form a second germanium-containing material directly against the first germanium-containing material; and
   wherein the first germanium-containing material is less pure in germanium than the second germanium-containing material.

9. The method of claim 8 wherein the reductant comprises $H_2$.

10. The method of claim 8 wherein the reductant comprises $NH_3$.

* * * * *